(12) United States Patent
Heinrich et al.

(10) Patent No.: US 8,877,597 B2
(45) Date of Patent: Nov. 4, 2014

(54) EMBEDDING METAL SILICIDE CONTACT REGIONS RELIABLY INTO HIGHLY DOPED DRAIN AND SOURCE REGIONS BY A STOP IMPLANTATION

(75) Inventors: Jens Heinrich, Wachau (DE); Frank Feustel, Dresden (DE); Kai Frohberg, Niederau (DE)

(73) Assignee: GLOBALFOUNDRIES Inc., Grand Cayman (KY)

(*) Notice: Subject to any disclaimer, the term of this patent is extended or adjusted under 35 U.S.C. 154(b) by 263 days.

(21) Appl. No.: 13/208,972

(22) Filed: Aug. 12, 2011

(65) Prior Publication Data

US 2012/0161210 A1 Jun. 28, 2012

(30) Foreign Application Priority Data

Dec. 28, 2010 (DE) .................. 10 2010 064 287

(51) Int. Cl.
| | |
|---|---|
| H01L 21/336 | (2006.01) |
| H01L 29/66 | (2006.01) |
| H01L 29/08 | (2006.01) |
| H01L 21/285 | (2006.01) |
| H01L 29/78 | (2006.01) |
| H01L 29/10 | (2006.01) |
| H01L 21/8238 | (2006.01) |
| H01L 21/265 | (2006.01) |

(52) U.S. Cl.
CPC ..... *H01L 29/7848* (2013.01); *H01L 21/823807* (2013.01); *H01L 21/823871* (2013.01); *H01L 21/823814* (2013.01); *H01L 29/66636* (2013.01); *H01L 29/0847* (2013.01); *H01L 21/26586* (2013.01); *H01L 21/28518* (2013.01); *H01L 29/1083* (2013.01)

USPC .... 438/303; 438/305; 257/288; 257/E21.438; 257/E29.255

(58) Field of Classification Search
CPC ............. H01L 21/28518; H01L 29/0847; H01L 29/1083; H01L 29/7848; H01L 29/66636; H01L 21/336
USPC ........... 257/288, E21, 438, E29.255; 438/303
See application file for complete search history.

(56) References Cited

U.S. PATENT DOCUMENTS

| 5,508,212 A * | 4/1996 | Wang et al. .................. 438/305 |
| 2004/0061228 A1* | 4/2004 | Wieczorek et al. ........... 257/750 |
| 2006/0024935 A1* | 2/2006 | Yue et al. ...................... 438/581 |

(Continued)

FOREIGN PATENT DOCUMENTS

| JP | 2003173985 A | 6/2003 |
| WO | 2007/126909 A1 | 11/2007 |

OTHER PUBLICATIONS

Translation of Official Communication from German Patent Application No. 10 2010 064 287.8 dated Jul. 20, 2011.

*Primary Examiner* — Minh-Loan Tran
*Assistant Examiner* — Fazli Erdem
(74) *Attorney, Agent, or Firm* — Amerson Law Firm, PLLC

(57) ABSTRACT

When forming metal silicide regions, such as nickel silicide regions, in sophisticated transistors requiring a shallow drain and source dopant profile, superior controllability may be achieved by incorporating a silicide stop layer. To this end, in some illustrative embodiments, a carbon species may be incorporated on the basis of an implantation process in order to significantly modify the metal diffusion during the silicidation process. Consequently, an increased thickness of the metal silicide may be provided, while not unduly increasing the probability of creating contact failures.

17 Claims, 4 Drawing Sheets

(56) References Cited

U.S. PATENT DOCUMENTS

| | | | |
|---|---|---|---|
| 2007/0049014 A1* | 3/2007 | Chen et al. | 438/649 |
| 2007/0254461 A1* | 11/2007 | Wei et al. | 438/514 |
| 2008/0164491 A1 | 7/2008 | Liu et al. | |
| 2010/0001317 A1* | 1/2010 | Chen et al. | 257/192 |
| 2010/0237440 A1* | 9/2010 | Ito | 257/408 |
| 2012/0018815 A1* | 1/2012 | Toh et al. | 257/408 |
| 2014/0038374 A1* | 2/2014 | Chen et al. | 438/232 |

* cited by examiner

EMBEDDING METAL SILICIDE CONTACT REGIONS RELIABLY INTO HIGHLY DOPED DRAIN AND SOURCE REGIONS BY A STOP IMPLANTATION

BACKGROUND OF THE INVENTION

1. Field of the Invention

The present disclosure generally relates to the fabrication of integrated circuits, and, more particularly, to the fabrication of highly sophisticated field effect transistors, such as MOS transistor structures, requiring highly doped shallow junctions and a low series resistance.

2. Description of the Related Art

The manufacturing process for integrated circuits continues to improve in several ways, driven by the ongoing efforts to scale down the feature sizes of the individual circuit elements. Presently, and in the foreseeable future, the majority of integrated circuits are and will be based on silicon devices due to the high availability of silicon substrates and due to the well-established process technology that has been developed over the past decades. A key issue in developing integrated circuits of increased packing density and enhanced performance is the scaling of transistor elements, such as MOS transistor elements, to provide the immense number of transistor elements that may be necessary for producing complex integrated circuits, such as CPUs, memory devices, mixed signal devices and the like. One important aspect in manufacturing field effect transistors having reduced dimensions is the reduction of the length of the gate electrode that controls the formation of a conductive channel separating the source and drain regions of the transistor. The source and drain regions of the transistor element are conductive semiconductor regions including dopants of an inverse conductivity type compared to the dopants in the surrounding crystalline active region, e.g., a substrate or a well region.

Although the reduction of the gate length results in smaller and faster transistor elements, it turns out, however, that a plurality of issues are involved to maintain proper transistor performance for a reduced gate length. One challenging task in this respect is the provision of shallow junction regions, i.e., source and drain extension regions and drain and source regions connecting thereto, which nevertheless exhibit a high conductivity so as to minimize the resistivity in conducting charge carriers from the source via the channel and to the drain region.

Consequently, sophisticated implantation techniques are frequently applied in order to form very shallow yet moderately highly doped drain and source extension regions with a desired minimal lateral offset to the channel region, which is typically accomplished on the basis of appropriate offset spacer elements formed on the gate electrode structure. Furthermore, in order to adjust transistor characteristics, typically counter-doped regions or halo regions may be provided adjacent to the drain and source extension regions and adjacent to the channel region, which may require tilted implantation processes. Thereafter, the drain and source regions may be formed on the basis of an increased lateral offset obtained by a corresponding sidewall spacer structure, wherein typically a high concentration of the drain and source dopant species is incorporated so as to appropriately connect to the drain and source extension regions. Depending on the complexity of the lateral and vertical dopant profiles, additional implantation processes may be required so as to obtain the desired transition of the dopant concentration from the extremely shallow source and drain extension regions to the actual drain and source regions.

In an attempt to further reduce the overall series resistance of the current path in the transistor devices, in addition to reducing the channel length, the resistance of portions of the drain and source regions is lowered by incorporating a metal silicide, which may typically exhibit a lower sheet resistance compared to silicon even if highly doped. In sophisticated approaches, nickel as a refractory metal is frequently used for locally increasing the conductivity of doped silicon areas due to the moderately low resistance of nickel silicide compared to other metal silicide materials. Hence, nickel silicide is formed in surface areas of the drain and source regions and possibly in gate electrode structures to provide superior conductivity in these areas. Upon further reducing the overall transistor dimensions, which may typically be associated with reduction of the depth of the drain and source regions, the process of forming a nickel silicide may have to be precisely controlled in order to avoid irregularities or total contact failures, such as an increase in series resistance of advanced transistors, contact punch through and the like, as will be explained in more detail with reference to FIGS. 1a-1b.

FIG. 1a schematically illustrates a cross-sectional view of a semiconductor device 100 comprising a transistor 150, which is formed in and above an active region 102A, which in turn is formed in a semiconductor layer 102. Furthermore, the semiconductor layer 102 is formed above a substrate 101, such as a silicon substrate and the like. The semiconductor layer 102 in combination with the substrate 101 may form a silicon-on-insulator (SOI) configuration when a buried insulating material (not shown) is formed below the semiconductor layer 102. In other cases, the active region may directly connect to an inversely doped crystalline semiconductor material of the substrate 101, thereby forming a bulk configuration. It should be appreciated that an active region is to be understood as a semiconductor region in the semiconductor layer 102 that is appropriately laterally delineated by corresponding isolation structures (not shown), such as a shallow trench isolation and the like. Furthermore, an active region may be understood as a device region in and above which at least one transistor is to be formed. In the manufacturing stage shown, the transistor 150 comprises drain and source regions 151 of an appropriate vertical and lateral dopant profile. Moreover, a gate electrode structure 160 is formed on the active region 102A and thus on a channel region 152, i.e., a portion of the active region 102A that is positioned laterally between the drain and source regions 151 and which is separated from an electrode material 162 of the gate electrode structure 160 by a gate dielectric material 161. Moreover, the gate electrode structure 160 comprises a spacer structure 163, which is typically comprised of one or more spacer elements in combination with corresponding etch stop liners (not shown). Moreover, in the example shown, a metal silicide, such as a nickel silicide material, is formed in the gate electrode structure 160, as indicated by 164, and also a metal silicide is formed in the drain and source regions 151, as indicated by 153.

As discussed above, in sophisticated applications, i.e., in semiconductor devices in which the transistor 150 may be formed on the basis of critical dimensions of 100 nm and significantly less, for instance 50 nm and less, typically the length of the channel region 152 may be the same order of magnitude and may thus require very sophisticated dopant profiles for the drain and source regions 151, which may have to provide high conductivity, thereby requiring high dopant levels, while at the same time generally the dopant may have to be provided with a very shallow vertical profile in order to achieve the required transistor performance. In this case, however, the incorporation of the metal silicide material 153 into the drain and source regions 151 may frequently result in significant irregularities, such as a shorting of a PN junction 151P, for instance when the metal silicide 153 may extend into the channel region 152, thereby significantly affecting the overall transistor behavior. For example, it is well known that nickel silicide may form a Schottky contact with doped silicon material, wherein the Schottky barrier may be moderately high for a weakly doped silicon material. In this case, any portion of the metal silicide region 153 extending into the moderately weakly doped channel region 152 of the active region 102A may thus substantially not contribute to the overall current flow due to the significant Schottky barrier. Consequently, the overall series resistance of the transistor 150 may be significantly increased.

The semiconductor device 100 comprising the metal silicide 153 is typically formed on the basis of the following process techniques which, however, may result in certain irregularities upon forming the metal silicide 153. The active region 102A is laterally delineated in the semiconductor layer 102 by forming isolation regions, which typically includes sophisticated lithography techniques, etch processes, deposition techniques, anneal processes and planarization techniques, for instance when sophisticated shallow trench isolations are to be provided. Prior to or after forming the isolation regions, the appropriate basic doping in the active region 102A may be established by performing implantation processes in combination with associated masking steps. Material for the gate electrode structure 160 may be formed, for instance, by deposition, oxidation and the like, depending on the desired configuration of the gate electrode structure 160. For example, in sophisticated applications, the gate dielectric material 161 may be provided as a very thin silicon oxide-based material, possibly in combination with a high-k dielectric material, while in other cases any such sophisticated gate materials may be provided in a late manufacturing stage. Moreover, the gate electrode material 162 may be provided, for instance in the form of a semiconductor material, a metal-containing material and the like. Next, sophisticated lithography techniques and patterning strategies are applied, possibly with sophisticated hard mask approaches and the like, as required for forming the gate electrode structure 160 so as to have the desired lateral dimensions. In a further advanced manufacturing stage, at least a portion of the drain and source regions 151 may be formed, for instance by ion implantation, followed by the formation of the spacer structure 163, which may act as an implantation mask for adjusting the lateral and vertical profile of a further portion of the drain and source regions 151, wherein, however, as discussed above, sophisticated implantation techniques have to be applied in order to form the drain and source regions 151 with a desired reduced depth as required. Thereafter, anneal processes may be applied, for instance based on short exposure times, in order to reduce the overall dopant diffusion, while nevertheless efficiently activating the dopant species in the drain and source regions 151. After any high temperature processes, the device 100 is prepared for the subsequent formation of the metal silicide 153, which is typically accomplished by depositing a refractory metal layer, such as a nickel layer, and initiating a chemical reaction with the underlying silicon material. During the responding heat treatment, the nickel species diffuses into the silicon material, thereby increasingly forming a metal silicide, such as a nickel silicide. Consequently, the finally obtained thickness, as indicated by 153D, of the metal silicide 153, sensitively depends on the diffusion behavior of the refractory metal, the process conditions, such as temperature, and the preparation of the surface of the device 100 prior to applying the refractory metal. Generally, an increased depth 153D is advantageous in view of providing a reduced series resistance in the transistor 150, since the metal silicide 153 has a significantly higher conductivity compared to the even highly doped drain and source regions 151. On the other hand, controlling the silicidation process so as to achieve a depth 153D which is similar to the depth of the drain and source regions 151, may be associated with a high probability of causing any short circuits of the PN junction 151P, as explained above. Consequently, in sophisticated devices, typically the silicidation process is controlled so as to reduce the risk of shorting the PN junctions 151P.

FIG. 1b schematically illustrates the device 100 in a further advanced manufacturing stage, wherein additionally the depth 153D of the metal silicide regions 153 is controlled so as to substantially avoid the shorting of the PN junctions 151P. Thus, a significantly reduced thickness 153D is obtained which, however, may result in an extremely narrow process window during the further processing when forming a contact level 120 of the device 100. When forming contact elements in a dielectric material 121 of the contact level 120, corresponding openings 122 have to be formed so as to connect to the metal silicide regions 153 in the drain and/or source regions of the transistor 150. During the complex etch process, a final stage of the metal silicide 153 has to be exposed which, however, may result in a punch through of the metal silicide 153 due to the reduced thickness 153D. In this case, the opening 122 may extend deeply into the drain and source regions 151 and may even result in a shorting of the corresponding PN junctions 151P after filling the contact opening 122 with an appropriate conductive material, such as tungsten and the like. Consequently, in sophisticated applications, the processes of forming the metal silicide 153 in the drain and source regions 151 is closely interrelated with the subsequent process for forming contact elements, thereby requiring tightly set process windows in both of these processes, which may thus result in a compromised transistor performance, while nevertheless also a certain probability of creating transistor irregularities or total contact failures may exist.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Basically, the present disclosure provides manufacturing techniques and semiconductor devices in which superior controllability of appropriately adjusting the depth of metal silicide regions may be accomplished by implementing a silicide stop layer at a desired depth within the drain and source areas of a transistor device. In some illustrative aspects disclosed herein, the silicide stop layer may be implemented by implanting a specific silicide stop species, such as carbon, which may thus significantly modify the diffusion behavior of the metal material, thereby providing superior controllability of the silicidation process. Hence, the available depth of the drain and source regions, even if provided as very shallow dopant profiles, may be efficiently used for forming the metal silicide, thereby also providing superior process conditions during the subsequent processing, for instance when forming contact openings so as to connect to the metal silicide regions.

One illustrative method disclosed herein comprises forming drain and source regions in an active region of a transistor in the presence of a gate electrode structure. The method further comprises implanting a silicide stop species into the drain and source regions at a predefined depth. Additionally, the method comprises forming a metal silicide in a portion of the drain and source regions by using the silicide stop species so as to control a depth of the metal silicide.

A further illustrative method disclosed herein comprises forming a silicide stop layer at least in a portion of an active region of a transistor at a first depth. Moreover, the method comprises forming drain and source regions in the active region so as to extend to a second depth below the first depth. Additionally, the method comprises forming a metal silicide in the drain and source regions so as to substantially extend to the first depth.

One illustrative semiconductor device disclosed herein comprises an active region and a gate electrode structure formed thereon. Moreover, the semiconductor device comprises drain and source regions formed in the active region and a silicide stop layer that is formed in the drain and source regions. Additionally, the semiconductor device comprises a metal silicide formed in the drain and source regions and extending to the silicide stop layer.

BRIEF DESCRIPTION OF THE DRAWINGS

The disclosure may be understood by reference to the following description taken in conjunction with the accompanying drawings, in which like reference numerals identify like elements, and in which.

Figure 1A:
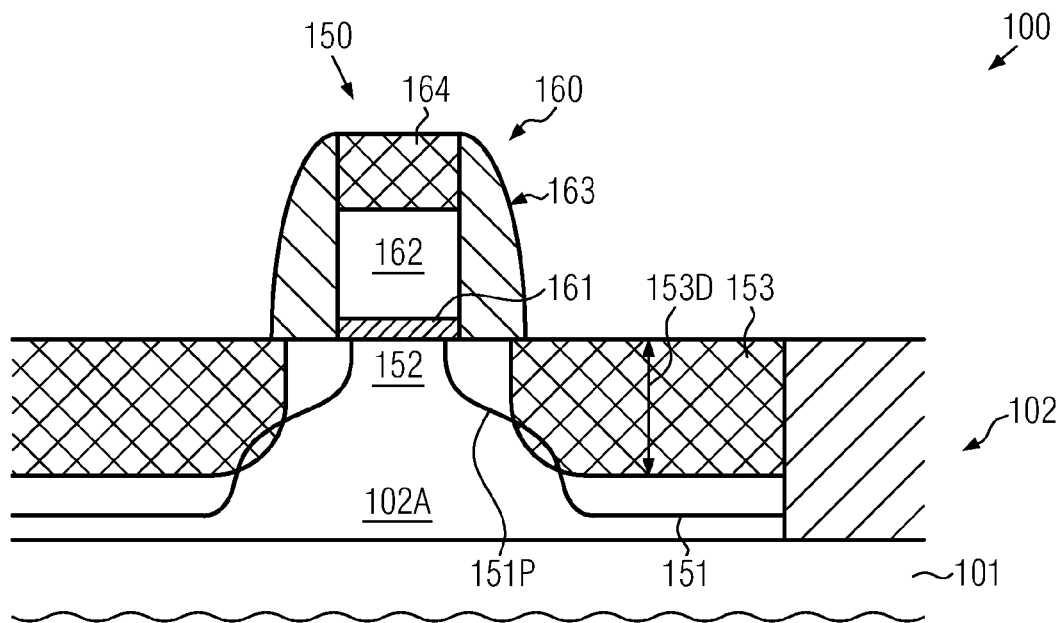
FIG. 1a schematically illustrates a cross-sectional view of a semiconductor device comprising a complex transistor element in which a metal silicide in shallow drain and source regions may extend into the channel region, thereby significantly modifying the overall transistor characteristics.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally contemplates manufacturing techniques and semiconductor devices in which superior controllability may be achieved when forming metal silicide in drain and source regions, such as shallow drain and source regions, by incorporating a silicide stop layer at a desired depth within at least a portion of the drain and source regions. To this end, in some illustrative embodiments, an implantation process may be applied so as to implant a silicide stop species, such as a carbon species, wherein the implantation may be performed at any appropriate manufacturing stage with appropriately selected implantation parameters, such as dose and energy, in order to obtain a desired layer thickness at a specific depth that is less than a depth of the drain and source regions to be formed, thereby significantly reducing the probability of creating short circuits of the PN junctions, while at the same time an increased thickness of the metal silicide may be obtained. The silicide stop species may be implanted, for instance, in a process stage in which drain and source extension regions may be provided, while, in other cases, prior to or after forming deep drain and source regions, the stop species may be incorporated. Consequently, the same masking regime may be used as may be required for forming the drain and source extension regions and the deep drain and source regions so that the stop species may be incorporated without requiring any additional lithography steps. In other illustrative embodiments, the stop species or at least a part thereof may be incorporated at an early manufacturing stage, for instance prior to or after forming active regions and prior to forming any gate electrode structures. In this manner, superior surface conditions may be provided so as to more precisely control the penetration depth of the implanted species, which may enable a precise positioning of the stop layer in an early manufacturing stage. In other illustrative embodiments disclosed herein, the stop layer may be incorporated on the basis of an epitaxial growth process when drain and source species are to be provided on the basis of an in situ doped semiconductor material and/or when a performance enhancing mechanism is to be implemented, for instance in the form of a strained semiconductor material, which is to be formed in the drain and source areas of at least some transistors.

Figure 1B:
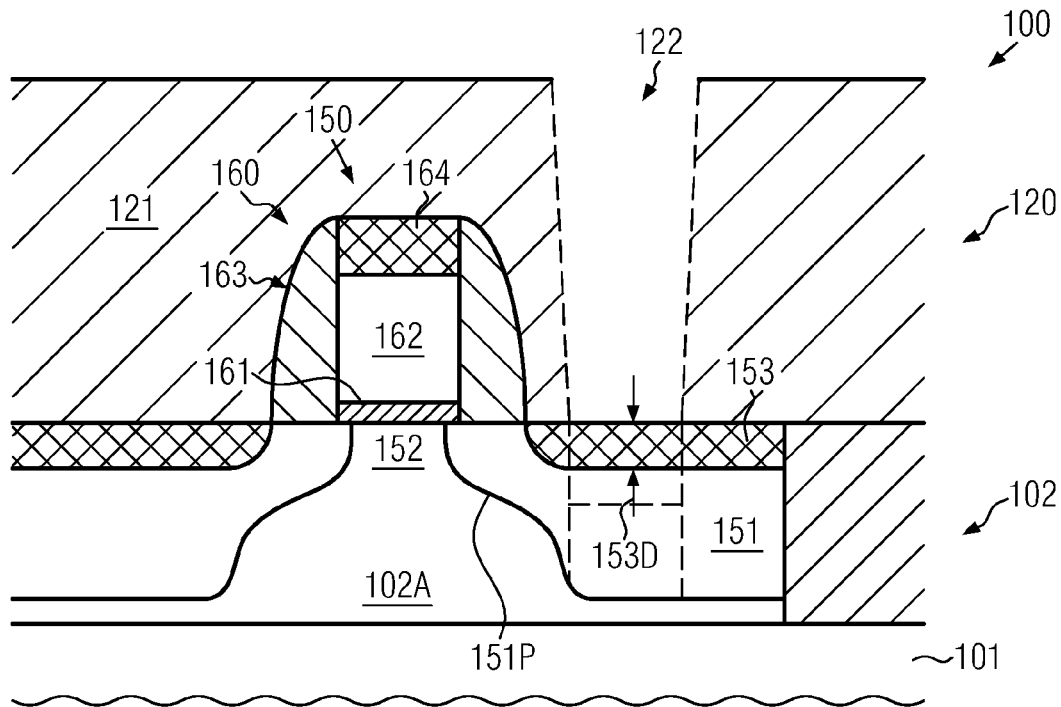
FIG. 1b schematically illustrates the semiconductor device according to a further conventional example in which a reduced metal silicide depth is implemented in order to avoid PN junction shorting, which, however, may result in a significant risk of etching through the metal silicide upon forming contact elements, according to conventional strategies.

With reference to FIGS. 2a-2f, further illustrative embodiments will now be described in more detail, wherein reference may also be made to FIGS. 1a-1b, if required.

Figure 2A:
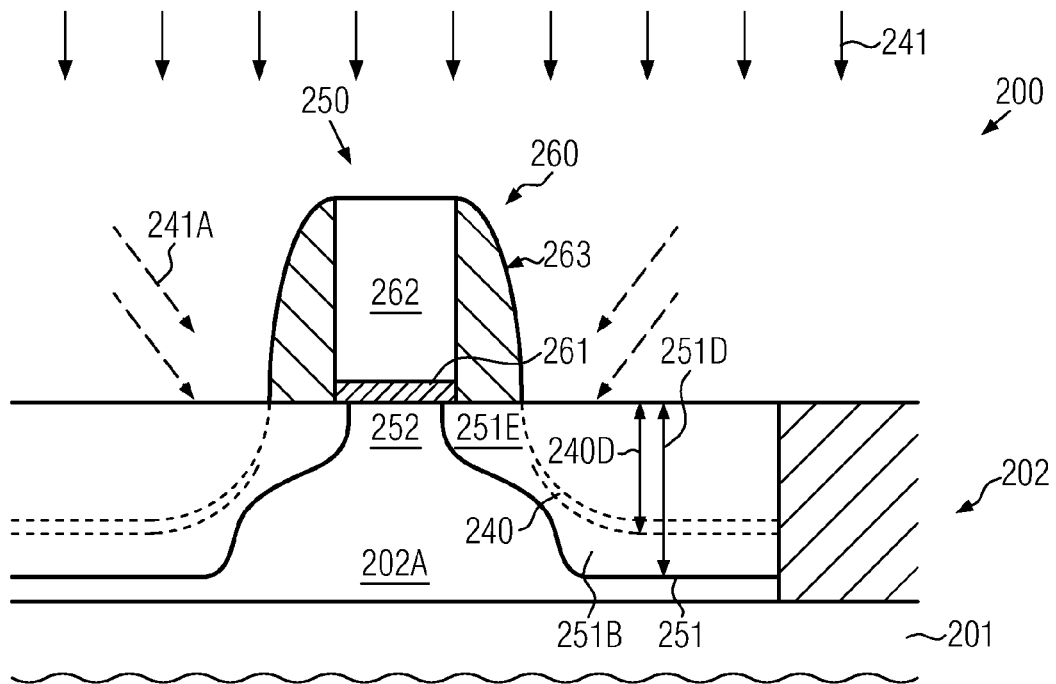
FIGS. 2a-2b schematically illustrate cross-sectional views of a semiconductor device during various manufacturing stages in forming a metal silicide with superior controllability with respect to a penetration depth of the metal silicide by using an implanted silicide stop layer, according to illustrative embodiments.

FIG. 2a schematically illustrates a cross-sectional view of a semiconductor device 200 comprising a substrate 201 and a semiconductor layer 202 in which a plurality of active regions are provided. For convenience, a single active region 202A is illustrated in FIG. 2a, which may correspond to a transistor 250, such as a P-channel transistor or an N-channel transistor. It should be appreciated that, with respect to the configuration of the substrate 201, the semiconductor layer 202 and the active region 202A, similar criteria may apply as previously explained with reference to the semiconductor 100. Similarly, the transistor 250 may have a sophisticated architecture, for instance requiring shallow drain and source regions 251 formed in the active region 202A, while a channel region 252 may have a length of approximately 50 nm and less, as is for instance also discussed above. It should be appreciated that the length direction and thus the current flow direction of the transistor 250 may correspond to the horizontal direction in FIG. 2a. Moreover, a gate electrode structure 260 may be provided above the channel region 252 and may thus have a corresponding gate length, i.e., in FIG. 2a, the horizontal extension of an electrode material 262, which is separated from the channel region 252 by a gate dielectric material 261. Furthermore, in this manufacturing stage, the gate electrode structure 260 may comprise a spacer structure 263 having any appropriate configuration so as to define the lateral and vertical profile of the drain and source regions 251. Moreover, as shown, a silicide stop layer 240 may be formed within the drain and source regions 251 and may be positioned at a specific depth, as indicated by 240D, which may be less than a depth 251D of deep drain and source areas 251B of the drain and source regions 251. The silicide stop layer 240 may represent any material composition which may exhibit a reduced diffusion of a metal species, such as nickel, which may be provided in a later manufacturing stage in order to convert a significant portion of the doped silicon material in the drain and source regions 251 into a metal silicide. For example, the layer 240 may comprise a carbon species in combination with the silicon base material, thereby forming an SIC combination, which may significantly slow down the migration of nickel and other metal species within the layer 240. For example, a carbon concentration of approximately one to several atomic percent within the layer 240 relative to the silicon base material may result in a significant modification of the diffusion behavior of a metal species. On the other hand, the presence of the carbon species may not unduly affect the overall electronic characteristics of the drain and source regions 251, such as the series resistance and the like. In other cases, the silicide stop layer 240 may comprise other atomic species, such as nitrogen and the like, which may also form, in combination with the silicon base material, an efficient barrier for the metal diffusion that is to be induced in a later manufacturing stage.

The semiconductor device 200 as shown in FIG. 2a may be formed on the basis of the following processes. The active region 202A and the gate electrode structure 260 may be formed on the basis of any appropriate process strategy, as is for instance also discussed above with reference to the semiconductor device 100. In some illustrative embodiments, thereafter drain and source extension regions 251E may be formed on the basis of the gate electrode structure 260 and with an appropriate offset spacer (not shown), followed by the formation of the spacer structure 263. Next, a further implantation process may be performed in combination with an appropriate implantation masking regime in order to incorporate further drain and source dopant species for forming the deep drain and source regions 251B, while using the gate electrode structure 260 including the spacer structure 263 as an implantation mask. Prior to or after the incorporation of the drain and source dopant species for the deep drain and source regions 251B, a further implantation process 241 may be applied in order to incorporate a silicide stop species, such as a carbon species in order to form the stop layer 240 at the desired depth 240D. To this end, implantation energy and dose may be appropriately determined, for instance by experiments, simulation and the like, in order to position the species at the desired depth 240D. It should be appreciated that, due to the nature of an implantation process, the corresponding implanted species may have a varying concentration in depth, wherein it may be assumed that a concentration maximum may be positioned at the center of the layer 240, wherein the concentration may drop by at least two orders of magnitude within a range of 10 nm or less, depending on the selected implantation parameters. For example, for a maximum concentration of the silicide stop species, such as carbon, of, for example, 3 atomic percent, the thickness of the layer 240 may be defined by the location below the maximum concentration at which the concentration may be at 0.03 atomic percent or less. In a similar manner, the upper border of the layer 240 may be determined. In order to determine a desired maximum concentration of the silicide stop species, corresponding experiments may be performed on the basis of process parameters used in a subsequent silicidation process in order to determine a correlation between the desired stop capabilities of the layer 240 in relation to the corresponding maximum concentration of the respective stop species.

In other illustrative embodiments, in addition to or alternatively to the implantation process 241 performed on the basis of a substantially zero tilt angle, a tilted implantation step, as indicated by 241A, may be implemented so as to form the layer 240 in the vicinity or within the extension regions 251E. Also in this case, appropriate implantation parameters, such as tilt angle, dose and energy, may be readily determined by simulation, experiments and the like.

Figure 2B:
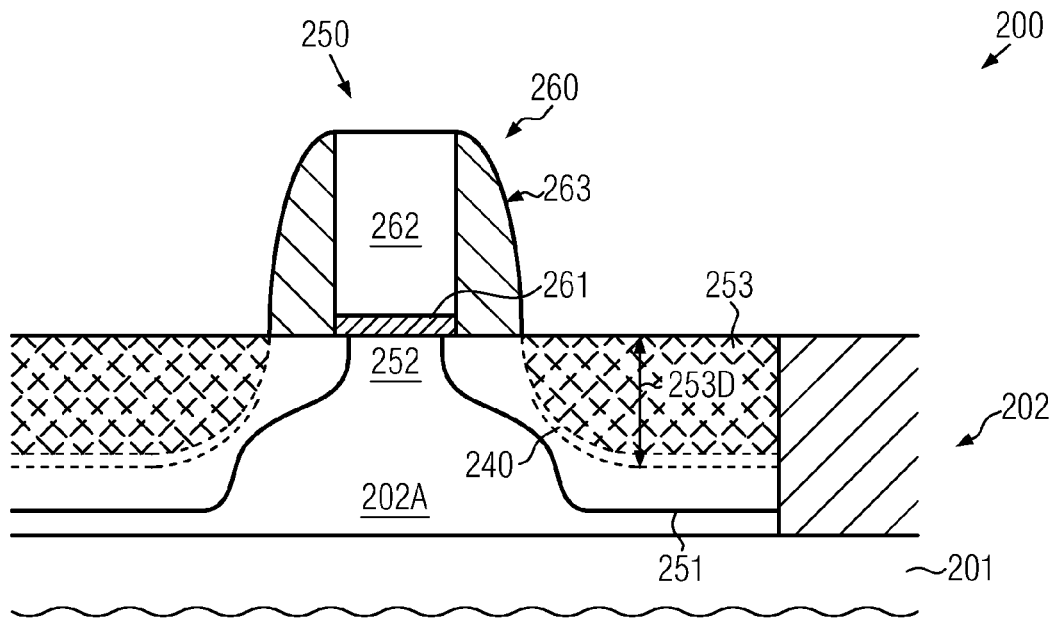

FIG. 2b schematically illustrates the device 200 in a further advanced manufacturing stage. As illustrated, a metal silicide 253, such as a nickel silicide, may be formed in the drain and source regions 251 and may extend substantially down to the silicide stop layer 240. The metal silicide 253 may be formed on the basis of any appropriate process strategy as, for instance, also discussed above with reference to the device 100 wherein, however, superior controllability of the depth 253D may be achieved, since the metal diffusion may be significantly closed down or may even be substantially completely blocked at and within the layer 240. Hence, by selecting the depth of the layer 240, also the degree of silicidation of the drain and source regions 251 may be adjusted, thereby obtaining superior conductivity while at the same time reducing the probability of creating any short circuits of the drain and source regions 251. It should be appreciated that a metal silicide may also be formed in the gate electrode structure 260 in some approaches, while in other cases a silicidation may be blocked by providing an appropriate dielectric cap layer (not shown), depending on the overall process strategy.

Consequently, the processing may be continued by forming a contact level, i.e., by providing an appropriate dielectric material or material system and patterning the same so as to form contact elements so as to connect to the drain and/or source regions 251, wherein, however, the probability of etching through the metal silicide region 253 having the well-controlled and increased depth 253D may be significantly reduced.

Figure 2C:
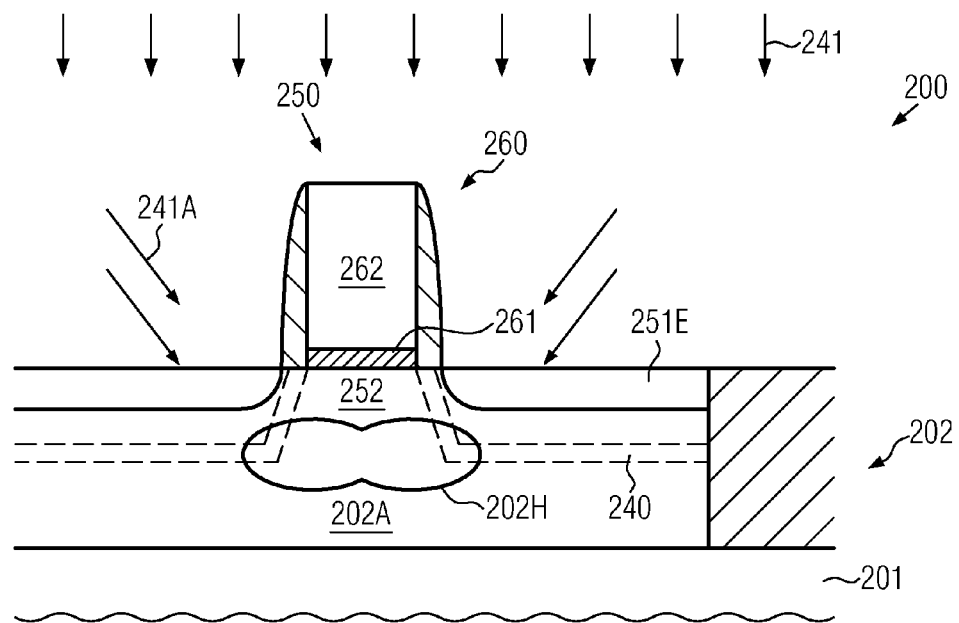
FIG. 2c schematically illustrates a cross-sectional view of the semiconductor device according to further illustrative embodiments in which a silicide stop layer may be implanted in an early manufacturing stage, i.e., upon forming drain and source extension regions.

FIG. 2c schematically illustrates the semiconductor device 200 according to further illustrative embodiments in which, prior to or after forming drain and source extension regions 251E and counter-doped areas or halo regions 202H in the active region 202A, the layer 240 may be incorporated, for instance by performing the implantation process 241, possibly in the form of a tilted implantation, such as the implantation step 241A, depending on the overall device requirements. For example, performing the implantation process 241 prior to providing the spacer structure 263 (FIG. 2a) may enable reducing the lateral offset of the stop layer 240 with respect to the channel region 252, thereby providing superior reliability of the stopping effect of the layer 240. With respect to selecting appropriate process parameters of the implantation process 241, the same criteria apply as previously discussed.

Figure 2D:
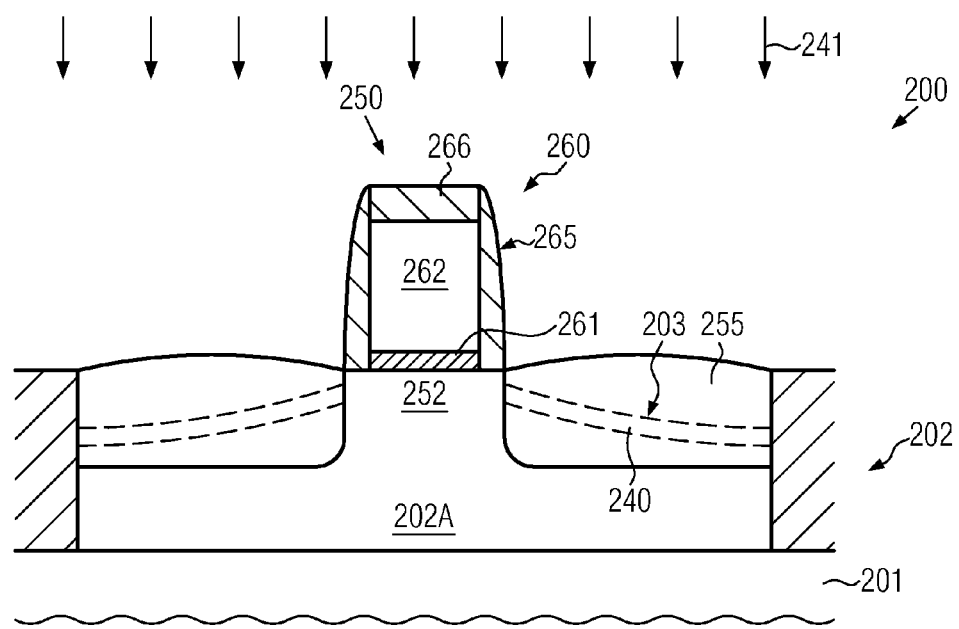
FIGS. 2d-2e schematically illustrate cross-sectional views of the semiconductor device according to various illustrative embodiments in which the silicide stop layer may be implemented in a semiconductor material provided on the basis of an epitaxial growth process.

FIG. 2d schematically illustrates the semiconductor device 200 according to further illustrative embodiments. As shown, cavities 203 may be provided in the active region 202A laterally offset from the gate electrode structure 260 in order to form a semiconductor material 255 therein, for instance in order to incorporate a drain and source dopant species in a highly controllable manner, while in other cases the material 255 may be provided as a strain-inducing semiconductor material, such as a silicon/germanium alloy and the like, thereby enhancing performance of the transistor 250. To this end, the cavities 203 may be formed on the basis of any appropriate etch strategy, while the gate electrode structure 260 may comprise appropriate spacer elements 265 in combination with a dielectric cap layer 266. Thereafter, the material 255 may be formed by a selective epitaxial growth process, in which material deposition may be restricted to semiconductor surface areas, while a significant material deposition on dielectric surface areas may be suppressed. Thereafter, the further processing may be continued by performing the implantation process 241 at any appropriate manufacturing stage, thereby forming the stop layer 240, as is also discussed above.

Figure 2E:
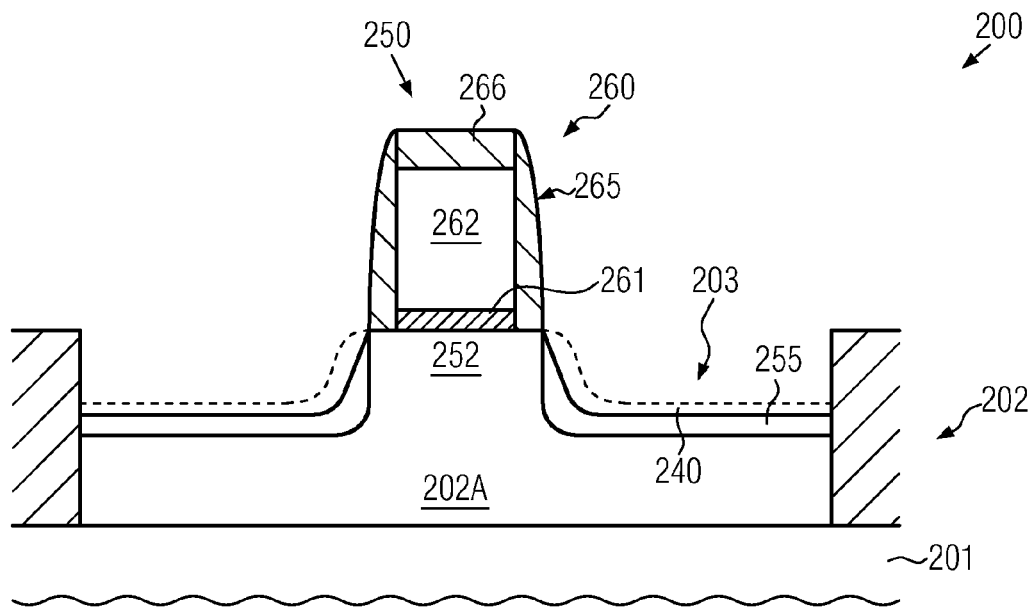

FIG. 2e schematically illustrates the device 200 according to further illustrative embodiments wherein the semiconductor material 255 may be grown in the cavities 203, as described above with reference to FIG. 2d, while at any appropriate stage of the deposition process, a silicide stop species may be incorporated into the deposition atmosphere in order to form the silicide stop layer 240. For example, the material 255 may be provided as an in situ doped silicon material, a silicon/germanium material and the like so as to incorporate a significant portion of the drain and source dopant species, while at the same time the layer 240 may be formed with high controllability and precision. That is, during the deposition, a desired species, such as carbon, may be supplied to the deposition atmosphere, which may thus be incorporated into the material 255 with a concentration and thickness that may be controlled on the basis of the deposition process. Thereafter, the deposition of the material 255 may be continued by discontinuing the supply of the silicide stop species so as to completely fill or overfill the cavities 203. After having formed the semiconductor material 255, the processing may be continued by any further process steps and finally the metal silicide may be formed by using the incorporated stop layer 240 as an efficient diffusion block layer, as is also discussed above.

Figure 2F:
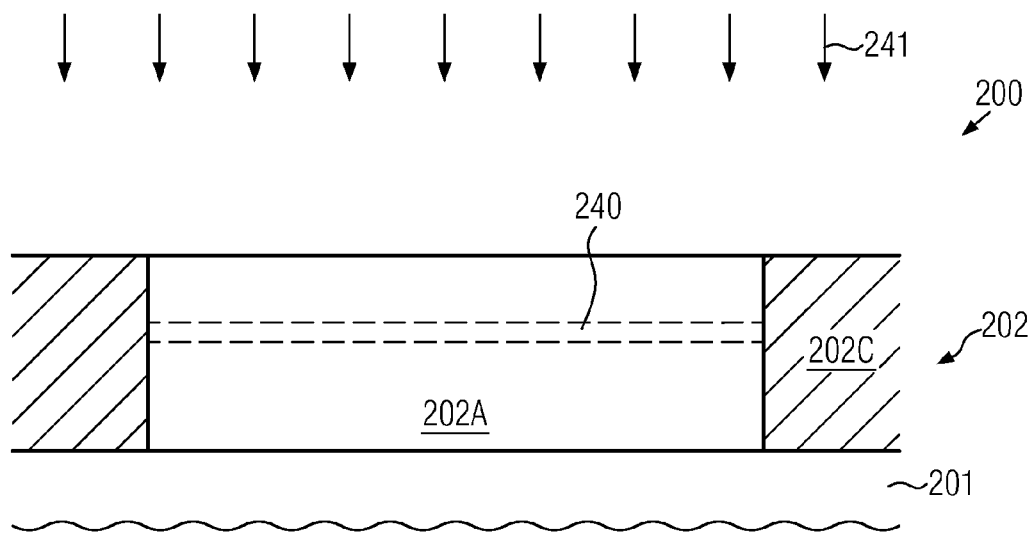
FIG. 2f schematically illustrates the semiconductor device according to further illustrative embodiments in which a silicide stop species may be incorporated into the active region in an early manufacturing stage, i.e., prior to forming a gate electrode structure.

FIG. 2f schematically illustrates the semiconductor device 200 according to further illustrative embodiments in an early manufacturing stage. As shown, the active region 202A may be provided, for instance based on corresponding isolation regions 202C, wherein, prior to or after the incorporation of any well dopant species, threshold adjusting species and the like, the implantation process 241 may be applied so as to incorporate the silicide stop layer 240, if the presence of the corresponding species in the channel region of the transistor still to be formed is considered appropriate. Consequently, in this manufacturing stage, the implantation 241 may be performed on the basis of a superior device topography, thereby enabling a precise incorporation of the layer 240 on the basis of an implantation process. Thereafter, the processing may be continued by forming a gate electrode structure and forming drain and source regions, as is also discussed above. If required, a further implantation process may be performed so as to incorporate further silicide stop species, if considered appropriate.

As a result, the present disclosure provides manufacturing techniques and semiconductor devices in which a silicide stop layer may be incorporated into the drain and source regions, for instance on the basis of implantation techniques, thereby achieving superior controllability of a silicidation process. In this manner, the available volume in drain and source regions for the silicidation process may be increased without increasing the probability of forming short circuits of the adjacent PN junctions. In this manner, overall performance of the transistors may be improved, for instance in terms of series resistance, while at the same time a wider process window for forming contact elements may be achieved.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a gate structure for a transistor above an active region formed in a semiconductor substrate;
    after forming said gate structure, performing an angled ion implantation process and a substantially vertically oriented ion implantation process to form an implanted silicide stop layer within at least in a portion of said active region of said transistor, said implanted silicide stop layer having a length and a thickness when viewed in a cross-section taken along a direction substantially parallel to a channel length of said transistor, wherein substantially the entire length of said implanted silicide stop layer is embedded in said active region and wherein a portion of said implanted silicide stop layer has a maximum depth of penetration relative to an upper surface of said active region;

forming a drain/source region in said active region such that said drain/source region has a bottom surface that is positioned below said maximum depth of penetration of said implanted silicide stop layer; and forming a metal silicide region in said drain/source region such that said metal silicide region extends at least from said upper surface of said active region and stops on at least a portion of said implanted silicide stop layer.

2. The method of claim 1, wherein said angled ion implantation process and said substantially vertically oriented ion implantation process are performed using one of carbon or nitrogen.

3. The method of claim 1, wherein said implanted silicide stop layer is formed prior to forming said drain/source region.

4. The method of claim 1, wherein said implanted silicide stop layer is formed after forming at least a portion of said drain/source region.

5. The method of claim 1, wherein said implanted silicide stop layer is formed such that it is a non-linear layer when viewed in cross-section.

6. The method of claim 1, wherein an upper end of said implanted silicide stop layer proximate said gate structure extends to said upper surface of said active region.

7. The method of claim 6, wherein a lower end of said implanted silicide stop layer proximate said gate structure is embedded within said active region.

8. A method, comprising:

forming a gate structure for a transistor above an active region formed in a semiconductor substrate;

after forming said gate structure, performing a substantially vertically oriented ion implantation process to form an embedded implanted silicide stop layer within said active region of said transistor, said embedded implanted silicide stop layer having a length and a thickness when viewed in a cross-section taken along a direction substantially parallel to a channel length of said transistor, wherein the entire length of said embedded implanted silicide stop layer is embedded in said active region below an upper surface of said active region and wherein a portion of said embedded implanted silicide stop layer has a maximum depth of penetration relative to said upper surface of said active region;

forming a drain/source region in said active region such that said drain/source region has a bottom surface that is positioned below said maximum depth of penetration of said embedded implanted silicide stop layer; and forming a metal silicide region in said drain/source region such that said metal silicide region extends at least from said upper surface of said active region and stops on at least a portion of said embedded implanted silicide stop layer.

9. The method of claim 8, wherein said substantially vertically oriented ion implantation process is performed using one of carbon or nitrogen.

10. The method of claim 8, wherein said embedded implanted silicide stop layer is formed prior to forming said drain/source region.

11. The method of claim 8, wherein said embedded implanted silicide stop layer is formed after forming at least a portion of said drain/source region.

12. The method of claim 8, wherein said embedded implanted silicide stop layer is formed such that it is a non-linear layer when viewed in cross-section.

13. A method, comprising:

prior to forming a gate structure for a transistor above an active region of semiconductor substrate, performing a substantially vertically oriented ion implantation process to form an embedded implanted silicide stop layer that extends across an entire width of said active region, wherein the entire length of said embedded implanted silicide stop layer is embedded within said active region and an upper surface of said embedded implanted silicide stop layer is positioned at a first depth below an upper surface of said active region;

after forming said embedded implanted silicide stop layer, forming a gate structure above said active region and above a portion of said embedded implanted silicide stop layer;

forming a drain/source region in said active region such that said drain/source region has a bottom surface that is positioned below said first depth; and forming a metal silicide region in said drain/source region such that said metal silicide region extends at least from said upper surface of said active region and stops on at least a portion of said embedded implanted silicide stop layer.

14. The method of claim 13, wherein said substantially vertically oriented ion implantation process is performed using one of carbon or nitrogen.

15. A method, comprising:

forming a gate structure for a transistor above an active region of a semiconductor substrate;

after forming said gate structure, forming a plurality of cavities in said substrate on opposite sides of said gate structure;

performing at least one epitaxial deposition process to form a semiconductor material in said plurality of cavities, wherein a silicide stop species is introduced during a first portion of said at least one epitaxial deposition process and stopped during other portions of said at least one epitaxial deposition process so as to thereby form a plurality of silicide stop layers comprised of said silicide stop species, each of said silicide stop layers having a length and a thickness when viewed in a cross-section taken along a direction substantially parallel to a channel length of said transistor, wherein substantially the entire length of each of said silicide stop layers is embedded in said active region and wherein a portion of each of said silicide stop layers has a maximum depth of penetration relative to an upper surface of said active region;

forming a plurality of drain/source regions such that said drain/source regions have a bottom surface that is positioned below said maximum depth of penetration of said silicide stop layers; and forming a metal silicide region in each of said drain/source regions such that each of said metal silicide regions extends at least from said upper surface of said active region and stops on at least a portion of one of said plurality of silicide stop layers.

16. The method of claim 15, wherein said silicide stop species is comprised of one of carbon or nitrogen.

17. The method of claim 15, wherein said silicide stop layer is formed such that is a non-linear layer when viewed in cross-section.

* * * * *